United States Patent
Gardner et al.

(10) Patent No.: US 6,222,240 B1
(45) Date of Patent: *Apr. 24, 2001

(54) SALICIDE AND GATE DIELECTRIC FORMED FROM A SINGLE LAYER OF REFRACTORY METAL

(75) Inventors: Mark I. Gardner, Cedar Creek; H. Jim Fulford, Austin, both of TX (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/120,557

(22) Filed: Jul. 22, 1998

(51) Int. Cl.[7] .................................................. H01L 29/76
(52) U.S. Cl. ............................ 257/410; 257/384; 257/915
(58) Field of Search ...................... 257/410, 915, 257/408, 412, 384

(56) References Cited

U.S. PATENT DOCUMENTS

| | | | |
|---|---|---|---|
| 4,109,371 | * 8/1978 | Shibata et al. | 438/305 |
| 4,683,645 | 8/1987 | Naguib et al. | 438/297 |
| 4,716,131 | * 12/1987 | Okazawa et al. | 257/410 |
| 4,731,339 | 3/1988 | Ryan et al. | 438/172 |
| 4,992,387 | 2/1991 | Tamura | 438/174 |
| 5,252,502 | * 10/1993 | Havemann | 257/384 |
| 5,268,590 | 12/1993 | Pfiester et al. | 257/764 |
| 5,445,977 | 8/1995 | Fujimoto | 438/174 |
| 5,576,227 | 11/1996 | Hsu | 438/291 |
| 5,583,067 | 12/1996 | Sanchez | 438/289 |
| 5,646,435 | 7/1997 | Hsu et al. | 257/382 |
| 5,654,570 | 8/1997 | Agnello | 257/338 |
| 5,717,254 | 2/1998 | Hashimoto | 257/773 |
| 5,821,594 | 10/1998 | Kasai | 257/410 |
| 5,834,811 | * 11/1998 | Huang | 257/408 |
| 5,918,130 | 6/1999 | Hause et al. | 438/290 |
| 5,959,337 | * 9/1999 | Gardner et al. | 257/410 |
| 6,084,280 | 7/2000 | Gardner et al. | 257/412 |

FOREIGN PATENT DOCUMENTS

| | | | |
|---|---|---|---|
| 1923279 | * 12/1970 | (DE) | 257/410 |
| 0614226 | * 9/1994 | (EP) | 257/915 |
| 59-034665 | 2/1984 | (JP) . | |
| 59-215774 | * 12/1984 | (JP) | 257/412 |
| 60-195978 | 10/1985 | (JP) . | |

OTHER PUBLICATIONS

Wolf, et al, "Silicon Processing For The VLSI Era, vol. 1: Process Technology," Lattice Press, Snset Beach, California, 1986, pp. 384–406; and pp. 516–518., Dec. 1986.

Wolf, "Silicon Processing For The VLSI Era, vol. 2: Process Technology," Lattice Press, Snset Beach, California, 1990, pp. 143–152, Dec. 1990.

* cited by examiner

Primary Examiner—Mark V. Prenty
(74) Attorney, Agent, or Firm—Kevin L. Daffer; Conley, Rose & Tayon

(57) ABSTRACT

An integrated circuit fabrication process is provided for forming a metal oxide gate dielectric and salicide structures from a unitary layer of refractory metal. The refractory metal layer is placed upon a silicon-based substrate before the formation of the gate conductor. A select portion of the refractory metal layer may thus be oxidized to form a relatively thick gate dielectric having a high κ value. A trench is etched through a masking layer to expose the select portion of the refractory metal layer prior to the oxidation step. A gate conductor may be formed within the trench upon the metal oxide gate dielectric. The masking layer may then be removed from the refractory metal layer. The refractory metal layer is annealed to form metal salicide upon the silicon-based substrate exclusive of underneath the gate dielectric.

19 Claims, 5 Drawing Sheets

SALICIDE AND GATE DIELECTRIC FORMED FROM A SINGLE LAYER OF REFRACTORY METAL

BACKGROUND OF THE INVENTION

1. Field of the Invention

This invention relates to integrated circuit fabrication and, more particularly, to forming a metal oxide gate dielectric and salicide structures from a unitary layer of refractory metal, wherein the salicide structures are self-aligned to a pair of source and drain regions.

2. Description of the Related Art

Fabrication of an integrated circuit involves numerous processing steps. After impurity regions have been placed into a semiconductor substrate and gate areas defined upon the substrate, an interlevel dielectric is formed across the topography to isolate the gate areas and the impurity regions. Interconnect routing is then placed across the semiconductor topography and connected to the impurity regions and/or the gate areas by ohmic contacts formed through the interlevel dielectric. The entire process of making ohmic contacts to the impurity regions and/or the gate areas and routing interconnect material between the ohmic contacts is generally described as "metallization". As the complexity of integrated circuits has increased, the complexity of the metallization composition has also increased. Conductive materials other than metal are commonly used for metallization. As such, the term metallization is generic in its application.

Integrated circuits often employ active devices known as transistors. A transistor includes a pair of impurity regions, i.e., junctions, spaced apart by a gate conductor. A gate dielectric is interposed between the gate conductor and a semiconductor substrate within which the junctions reside. The junctions contain dopants which are opposite in type to the dopants residing within a channel region of the substrate interposed between the junctions. The gate conductor typically comprises polycrystalline silicon ("polysilicon") which is rendered conductive by implanting dopants therein. Polysilicon can withstand relatively high temperatures. Therefore, a polysilicon gate conductor may be formed prior to performing high-temperature anneal steps, such as the post-implant anneal of the junctions. As such, the gate conductor may be patterned before the source and drain junctions are formed and annealed. In fact, the gate conductor is commonly used as a channel region mask during the formation of the source and drain junctions. One of the disadvantages of using polysilicon as the gate conductor material, however, is that it has a significantly higher resistivity than metals, such as aluminum. The propagation delay of an integrated circuit employing a polysilicon gate conductor thus may be longer than desired.

Capacitive coupling between gate conductors and underlying channel regions of a substrate may be reduced to achieve high-frequency operation of an integrated circuit. Typically, the gate-to-substrate capacitance is decreased by reducing the thickness of the gate dielectric, which is commonly composed of silicon dioxide. However, relatively thin gate dielectrics tend to break down when subjected to an electric field. Electrons may pass through the thin gate dielectric by what is known as the quantum mechanical tunneling effect. As a result, a tunneling current may inadvertently flow between the two conductive layers. It would therefore be of benefit to develop a method for reducing capacitive coupling between the gate conductor and the substrate without decreasing the thickness of the gate dielectric.

The formation of ohmic contacts through an interlevel dielectric involves using a technique known as lithography to pattern a protective mask (i.e., photoresist) upon areas of the dielectric exclusive of where the contacts are to be formed. The areas of the interlevel dielectric left uncovered by the mask are then etched to form openings or "windows" through the interlevel dielectric to underlying junctions and gate conductors. The contact windows are filled with a conductive material to complete formation of the contacts. Unfortunately, the mask may be misaligned relative to the underlying topography during the lithography process. Accordingly, the contacts may be shifted from their targeted positions directly above the junctions and the gate conductors. As a result of the misalignment, the contact/junction and contact/gate conductor interfaces may experience increased contact resistances. The parasitic series resistances of the source and drain contact structures thus may be high enough to detrimentally affect the drive current of transistors employed by the integrated circuit To reduce the contact resistances at the contact/junction and contact/gate conductor interfaces, self-aligned low resistivity structures are commonly placed between the ohmic contacts and the junctions/gate conductors. The presence of these so-called self-aligned silicides (i.e., salicides) upon the junctions and gate conductors ensures that contact is made to the entire junction and gate areas. Further, forming salicide upon a polysilicon gate conductor helps lower the sheet resistance of the gate conductor. Salicide formed upon polysilicon is generally referred to as polycide. A salicide process involves depositing a refractory metal across the semiconductor topography, and then reacting the metal only in regions where a high concentration of silicon atoms are present. In this manner, salicides may be formed exclusively upon the junctions and the upper surfaces of polysilicon gate conductors. The sidewall surfaces which bound the gate conductors may be pre-disposed with sidewall spacers comprising silicon dioxide ("oxide"). The oxide spacers serve to prevent the refractory metal from contacting, and hence reacting with, the polysilicon at the sidewall surfaces of the gate conductor. Absent the oxide spacers, silicide could form upon the sidewall surfaces of the gate conductors, undesirably shorting the gate conductors to adjacent junctions.

Titanium silicide ($TiSi_2$) is attractive for salicide application because it exhibits low resistivity and can withstand process temperatures in excess of 800° C. Formation of a low resistivity $TiSi_2$ involves annealing a titanium layer placed over silicon at a relatively high temperature. Unfortunately, Ti is highly reactive with $SiO_2$ when heated to temperatures above 700° C. The relatively weak Si—O bonds of oxide are easily broken, permitting the reaction of Ti with both Si atoms and O atoms. As such, the presence of oxide spacers upon the sidewall surfaces of a gate conductor may not be adequate protection against lateral formation of silicide between the gate conductor and adjacent junctions. Also, titanium oxide may form within the spacers, degrading the integrity of the spacers. It would therefore be desirable to develop a technique for forming salicide upon the junctions of a transistor without being concerned that the junctions might be shorted to the gate conductor.

SUMMARY OF THE INVENTION

The problems outlined above are in large part solved by the technique hereof for forming a metal oxide gate dielectric and salicide structures from a unitary layer of refractory metal. The refractory metal layer is placed upon a silicon-based substrate before the formation of the gate conductor. A select portion of the refractory metal layer may thus be oxidized to form a relatively thick gate dielectric. The thickness of the gate dielectric is sufficient to prevent the unoxidized portions of the refractory metal layer from contacting the gate conductor. Absent any metal adjacent the sidewall surfaces of the gate conductor, an electrical short cannot be formed between the gate conductor and source and drain junctions arranged on opposite sides of the gate conductor. Further, no oxide sidewall spacers are required to prevent salicidation of the sidewall surfaces of the gate conductor. If oxide sidewall spacers are required for other reasons, they may be formed subsequent to the deposition of the refractory metal layer. As such, no metal atoms, e.g., Ti atoms, are available upon the oxide spacers to react with the $SiO_2$ to form a metal silicide. Initially depositing the refractory metal layer upon the substrate therefore advantageously provides protection against the formation of a conductive path between the gate conductor and the junctions.

Refractory metal oxides, e.g., $TiO_2$, advantageously have relatively high dielectric constants. The dielectric constant, κ, of a material is the permittivity of the material normalized to the permittivity of a vacuum. The permittivity of a material reflects the ability of the material to be polarized by an electric field. Therefore, capacitance between two layers of conductive material separated by a dielectric is directly proportional to the permittivity of the dielectric. As such, the metal oxide gate dielectric may be of sufficient thickness to avoid dielectric breakdown while still achieving high capacitive coupling between the gate conductor and the silicon substrate. The metal oxide gate dielectric is thermally grown by annealing the metal layer and simultaneously exposing it to an oxygen-bearing ambient. A metal oxide gate dielectric formed in this manner is more stoichiometric than a metal oxide layer deposited using chemical-vapor deposition ("CVD"). The thermally grown metal oxide contains less oxygen vacancies and dangling bonds than a CVD-deposited metal oxide. As such, the thermally grown metal oxide contains less diffusion pathways and less traps for foreign species. Hot carriers (i.e., hot holes or electrons) are thus less likely to become injected into and entrapped within the metal oxide gate dielectric. The quality of the metal oxide gate dielectric also affords reduced cross-diffusion of species between the gate conductor and the substrate. Therefore, thermally growing a metal oxide gate dielectric provides protection against subthreshold current leakage and shifts in the transistor threshold voltage.

According to an embodiment, a method is provided for forming an integrated circuit. A refractory metal layer comprising, e.g., Ti, is deposited across a silicon-based substrate. A masking layer is then formed upon the refractory metal layer. Thereafter, a trench is formed through the masking layer using optical lithography and an etch technique to thereby expose a select portion of the refractory metal layer. That select portion of the refractory metal layer is then heated while being exposed to an oxygen-bearing ambient. In this manner, the select portion of the refractory metal layer is oxidized to form a metal oxide gate dielectric, e.g., $TiO_2$. The masking layer is composed of a material that does not react with the refractory metal during the annealing process. The thickness of the masking layer may be controlled to prevent the oxygen-bearing ambient from reaching and reacting with underlying portions of the refractory metal layer. Silicon nitride ("nitride") serves as a good masking layer since it is substantially impermeable to oxygen. The thickness of the refractory metal layer is dictated by the desired thickness of the metal oxide gate dielectric. The thickness of the refractory metal layer must be adequate to provide for the thermal growth of a relatively thick gate dielectric having a thickness of, e.g., 100 to 300 Å.

Subsequent to forming the metal oxide gate dielectric, a gate conductor material may be deposited upon the gate dielectric and the masking layer to a level spaced above an upper surface of the masking layer. Preferably, the gate conductor material comprises a metal which has a lower resistivity than highly doped polysilicon. For example, the gate conductor material may comprise metals that can withstand high temperatures, e.g., W, Ti, Ta, or Co. A titanium nitride layer may be deposited across the gate dielectric and the masking layer prior to the deposition of the gate conductor material. The titanium nitride layer may serve as both a diffusion barrier layer and an adhesion layer at the base and sidewalls of the gate conductor. The gate dielectric upper surface may be removed to a level substantially coplanar with the upper surface of the masking layer using, e.g., chemical-mechanical polishing ("CMP"). If present, the titanium nitride layer residing upon the upper surface of the masking layer may also be removed in this manner. Because of its low sheet resistance, the resulting metal gate conductor does not require a polycide be formed upon its upper surface. Although less preferred, a polysilicon gate conductor may alternately be formed upon the metal oxide gate dielectric.

The masking layer may then be removed from the refractory metal layer that remains upon the silicon substrate. A source/drain ("S/D") implant may be self-aligned to the now-exposed sidewall surfaces of the gate conductor/TiN structure, thereby forming source and drain regions within the substrate laterally adjacent the gate conductor/TiN structure. Alternatively, a lightly doped drain ("LDD") implant may be self-aligned to the sidewall surfaces of the gate conductor/TiN structure. Dielectric sidewall spacers may be formed laterally extending from the opposed sidewall surfaces of the gate conductor/TiN structure before performing the source/drain implant. In this manner, graded junctions which include source and drain regions outside LDD areas are formed within the substrate.

Subsequently, the refractory metal layer may, for example, be heated to a temperature of 600 to 800° C. for approximately 15 to 60 seconds using a technique known as rapid thermal processing ("RTP"). In this manner, salicide structures comprising, e.g., $TiSi_2$ are formed upon the source and drain junctions. Any unreacted metal is removed from the semiconductor topography after the formation of the low resistivity salicide structures. The salicide structures are laterally apart by the metal oxide gate dielectric which comprises the same type of metal atoms as the salicide structures. The gate dielectric is sufficiently thick to inhibit the salicide structures from communicating with the gate conductor/TiN structure overlying the gate dielectric. In particular, the upper surface of the gate dielectric is elevated above the upper surfaces of the salicide structures. The elevational difference between the gate dielectric and the salicide structures results from the partial consumption of the substrate during the salicidation step. That is, the gate dielectric is formed above the substrate whereas the salicide structures are formed partially within the substrate.

BRIEF DESCRIPTION OF THE DRAWINGS

Other objects and advantages of the invention will become apparent upon reading the following detailed description and upon reference to the accompanying drawings in which:

FIG. 6a depicts a partial cross-sectional view of the semiconductor topography, wherein a gate conductor material is deposited across the TiN layer to a level spaced above the upper surface of the masking layer, subsequent to the step in FIG. 5a;

FIG. 7 depicts a partial cross-sectional view of the semiconductor topography, wherein the gate conductor material upper surface is removed to a level substantially coplanar with the upper surface of the masking layer while the TiN layer is concurrently removed from the upper surface of the masking layer, subsequent to the step in FIG. 6a;

FIG. 10b depicts a partial cross-sectional view of the semiconductor topography, wherein dielectric sidewall spacers are formed laterally extending for the opposed sidewall surfaces of the gate conductor/TiN structure, subsequent to the step in FIG. 10a;

Figure 1:
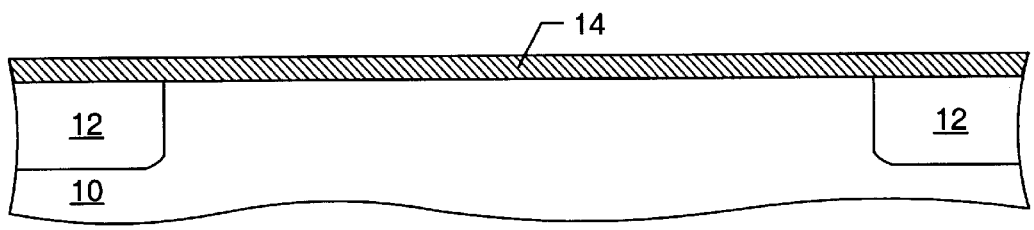
FIG. 1 depicts a partial cross-sectional view of a semiconductor topography, wherein a refractory metal layer is deposited across a silicon-based substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, FIG. 1 depicts a semiconductor substrate 10 upon which a refractory metal layer 14 has been formed. Substrate 10 comprises single crystalline silicon which has been slightly doped with n-type or p-type impurities. Shallow trench isolation structures 12 are arranged a spaced distance apart within substrate 10 to isolate ensuing active areas. The shallow trench isolation structures may alternatively be replaced with LOCOS structures. Refractory metal layer 14 may be sputter deposited from a metal target or MOCVD (i.e., metal organic CVD) deposited from a source comprising a volatile metal organic compound. Preferably, refractory metal layer 14 comprises approximately 50 to 200 Å of titanium; however, it may alternatively be composed of other metals, such as tantalum.

Figure 2:
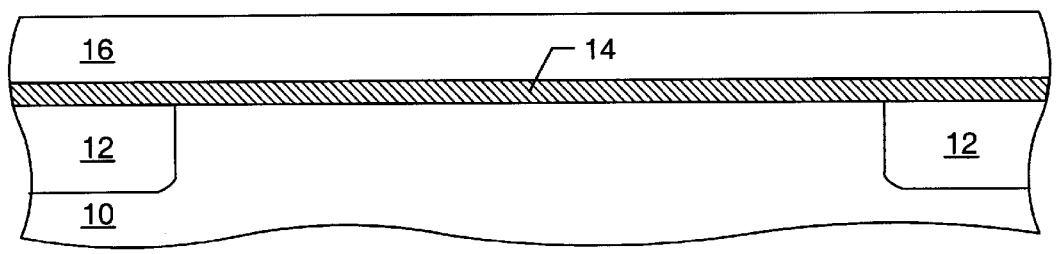
FIG. 2 depicts a partial cross-sectional view of the semiconductor topography, wherein a masking layer is formed upon the refractory metal layer, subsequent to the step in FIG. 1.
Figure 3:
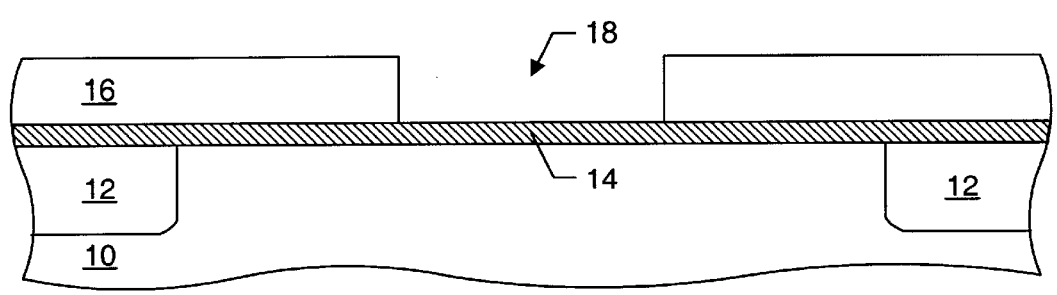
FIG. 3 depicts a partial cross-sectional view of the semiconductor topography, wherein a trench is etched through the masking layer to expose a select portion of the refractory metal layer, subsequent to the step in FIG. 2.

As shown in FIG. 2, a masking layer 16 is then CVD deposited across refractory metal layer 14. Masking layer 16 may comprise any material that is capable of inhibiting underlying refractory metal from being oxidized and that is inert in the presence of the refractory metal. Appropriate materials for masking layer 16 include, but are not limited to, nitride and silicon oxynitride. Nitride is preferred since it is provides a good barrier between the ambient and the underlying refractory metal layer 16. The thickness of masking layer 16 may range from, e.g., 500 to 1,000 Å, depending upon how resistant it is to penetration by an oxygen-containing ambient during a subsequent anneal step. FIG. 3 depicts a trench 18 being formed through masking layer 16 to expose a select portion of refractory metal layer 14. Trench 18 may be formed using optical lithography, followed by an etch technique, e.g., a dry, plasma etch. The etch duration is preferably terminated before substantial portions of refractory metal layer 14 can be removed.

Figure 4:
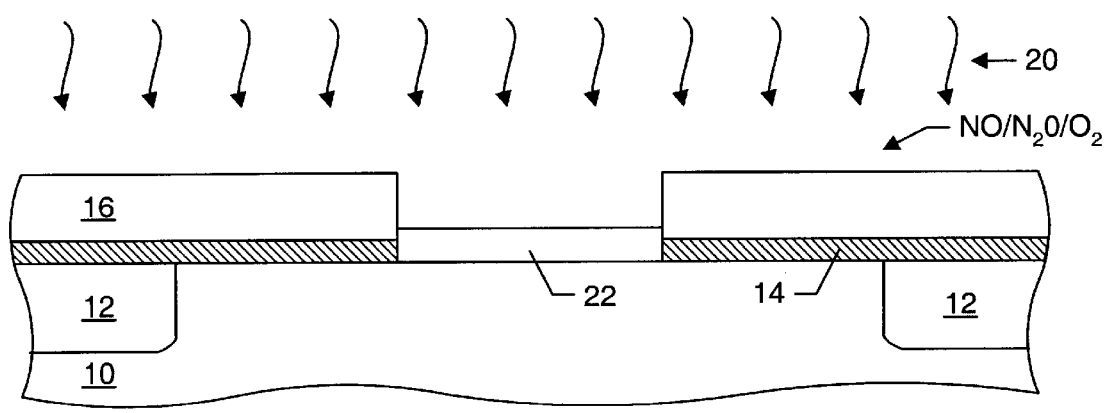
FIG. 4 depicts a partial cross-sectional view of the semiconductor topography, wherein the select portion of the refractory metal layer is oxidized to form a metal oxide gate dielectric, subsequent to the step in FIG. 3.

Subsequently, as depicted in FIG. 4, the select portion of refractory metal layer 14 not covered by masking layer 16 is oxidized to form a metal oxide gate dielectric 22 upon substrate 10. The oxidation step involves annealing that select portion of refractory metal layer 14 with radiation 20 while concurrently exposing it to an oxygen-bearing ambient. The oxygen-bearing ambient may comprise a molecule selected from the group consisting of NO, $N_2O$, and $O_2$. Radiation 20 may be thermal radiation supplied from an annealing furnace. Preferably, radiation 20 is radiant light supplied from e.g., an arc lamp or a tungsten-halogen lamp using RTP. The RTP may be performed at a temperature of 700 to 1,000° C. for approximately 10 to 60 seconds. The metal oxide gate dielectric 22 formed during the oxidation process has a dielectric constant greater than approximately 8.0. For example, metal oxide gate dielectric 22 may comprise $TiO_2$ which has a κ value of about 50. The $TiO_2$ layer 22 may be approximately 125 to 250 Å thick such that its capacitance is equivalent to a 10 to 20 Å layer of oxide (κ=3.8).

Figure 5A:
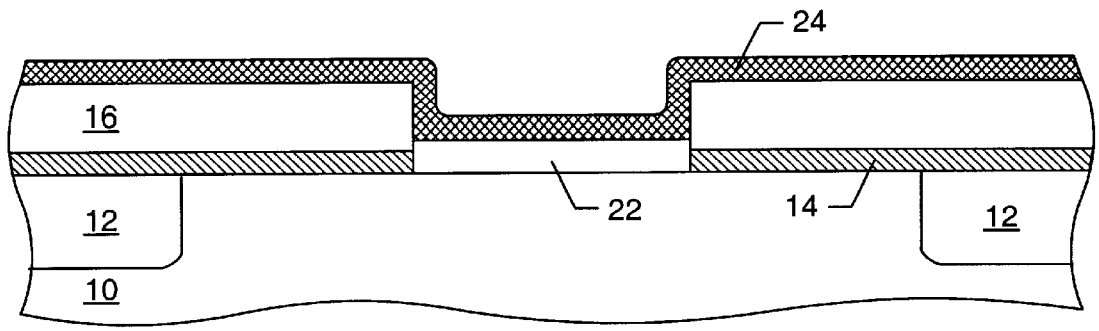
FIG. 5a depicts a partial cross-sectional view of the semiconductor topography according to one embodiment, wherein a TiN layer is deposited across the metal oxide gate dielectric and the masking layer, subsequent to the step in FIG. 4.
Figure 5B:
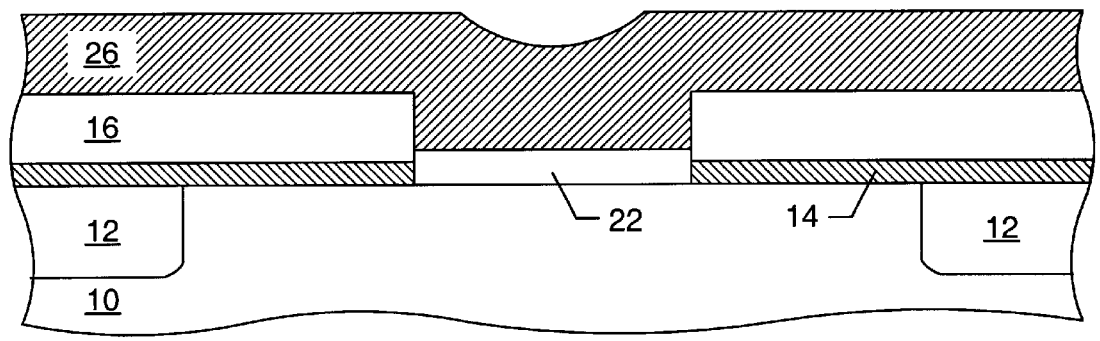
FIG. 5b depicts a partial cross-sectional view of the semiconductor topography according to another embodiment, wherein a gate conductor material is deposited across the metal oxide gate dielectric and the masking layer to a level spaced above the upper surface of the masking layer, subsequent to the step in FIG. 4.
Figure 6A:
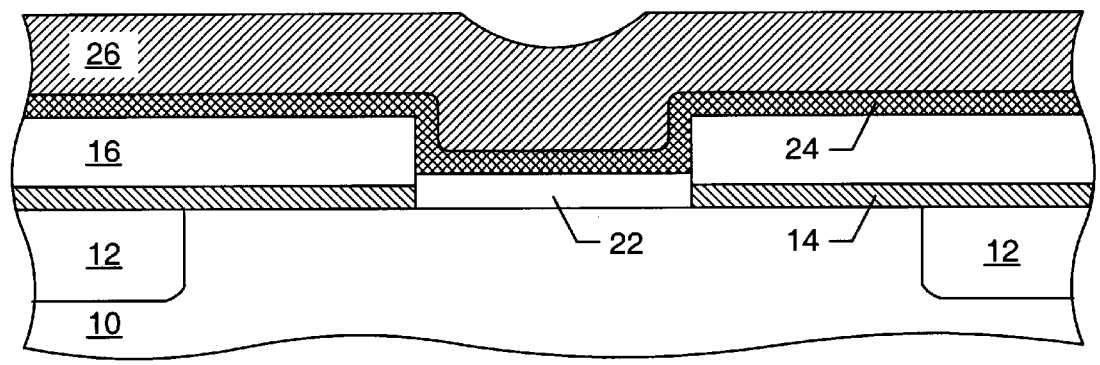
Figure 6B:
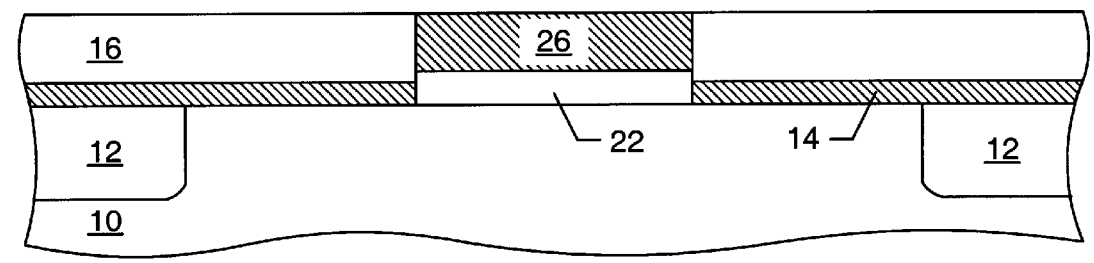
FIG. 6b depicts a partial cross-sectional view of the semiconductor topography, wherein the gate conductor material upper surface is removed to a level substantially coplanar with the upper surface of the masking layer, subsequent to the step in FIG. 5b.
Figure 7:
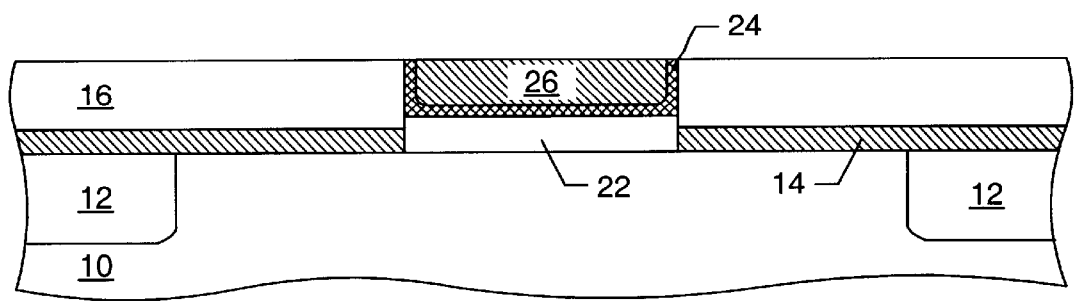

FIGS. 5a, 6a, and 7 and FIGS. 5b and 6b illustrate alternative embodiments of the processing steps to follow that shown in FIG. 4. As shown in FIG. 5a, a relatively thin layer (e.g., 100 Å) of TiN may be deposited across metal oxide gate dielectric 22 and masking layer 16. The TiN may, e.g., be formed by reactive sputtering Ti in an ambient containing N. Alternatively, as shown in FIG. 5b, a gate conductor material 26 may be deposited across gate dielectric 22 and masking layer 16 to a level spaced above the upper surface of the masking layer. FIG. 6a depicts a gate conductor material 26 being deposited across TiN layer 24, subsequent to the step shown in FIG. 5a. Gate conductor material 26 is preferably a metal, e.g., W, Ti, Ta, Co since the metals have a much lower resistivity than polysilicon. However, it is also possible that gate conductor material 26 is composed of polysilicon. Using W for gate conductor material 26 is preferred because W can withstand relatively high temperatures. Turning to FIG. 6b, gate conductor material 26 may be removed to a level substantially coplanar with the upper surface of masking layer 16 using, e.g., CMP, subsequent to the step depicted in FIG. 5b. A similar planarization step to be performed subsequent to the step in FIG. 6a is shown in FIG. 7. The TiN layer 24 that resides upon the horizontal upper surface of masking layer 16 is also removed during the planarization step shown in FIG. 7. Placing TiN layer 24 at the base and sidewalls of gate conductor 26 provides a barrier against diffusion between the gate conductor and adjacent areas and improves the adhesion between the gate conductor and adjacent material, e.g., gate dielectric 22.

Figure 8:
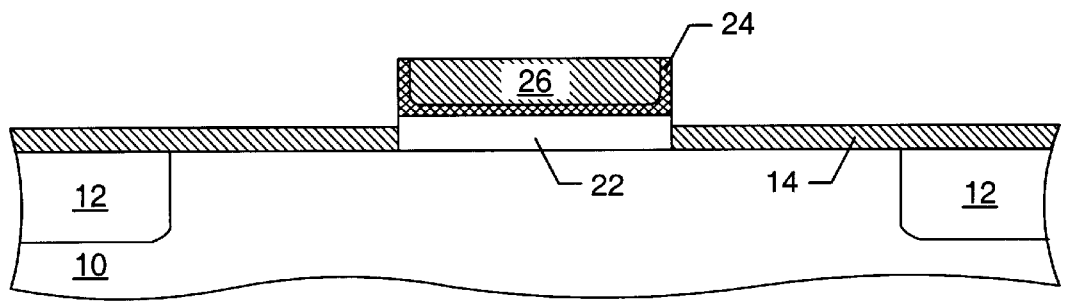
FIG. 8 depicts a partial cross-sectional view of the semiconductor topography, wherein the masking layer is removed from the refractory metal layer, subsequent to the step in FIG. 7.
Figure 9:
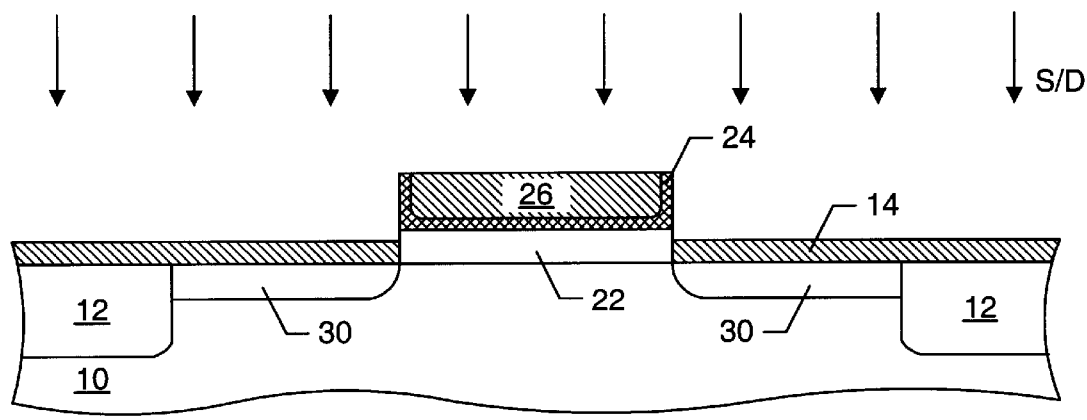
FIG. 9 depicts a partial cross-sectional view of the semiconductor topography according to one embodiment, wherein a source/drain implant is self-aligned to the opposed sidewall surfaces of the gate conductor/TiN structure to form source and drain regions within the substrate, subsequent to the step in FIG. 8.

Although the processing steps depicted in FIGS. 8–12 are performed upon the semiconductor topography depicted in FIG. 7, they may also be performed upon the topography depicted in FIG. 6b. As shown in FIG. 8, masking layer 16 is removed from refractory metal layer 14 using, e.g., a plasma etch technique that is highly selective to the masking layer material. Turning to FIG. 9, a S/D implant is then self-aligned to the exposed sidewall surfaces of the gate conductor/TiN structure to form source and drain regions 30 within substrate 10 exclusive of beneath gate dielectric 22. The formation of an NMOS transistor requires a S/D implant of n-type dopants, and the formation of a PMOS transistor requires S/D implant of p-type dopants. Appropriate n-type species include, but are not limited to, arsenic and phosphorus, and appropriate p-type species include, but are not limited to, boron and boron difluoride. It is to be understood that both NMOS and PMOS transistors may be formed within a unitary substrate to form a CMOS circuit by masking the ensuing NMOS active areas while implanting p-type dopants into the ensuing PMOS active areas, and vice-versa.

Figure 10A:
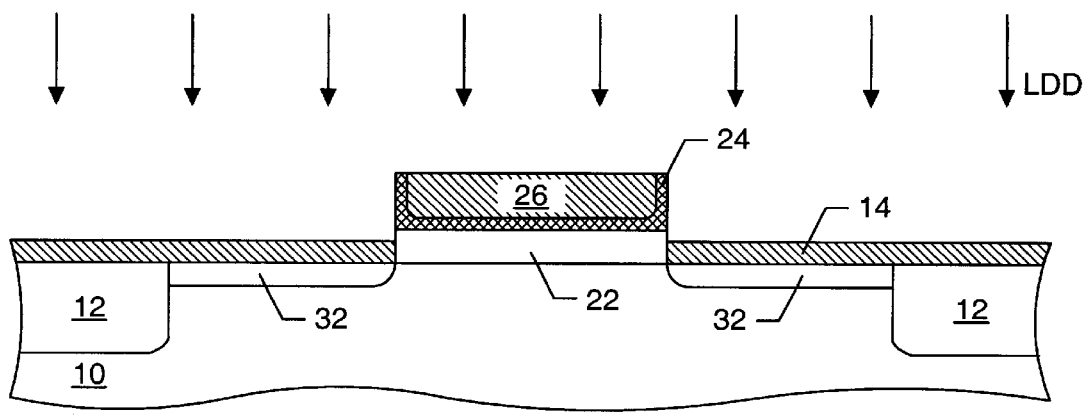
FIG. 10a depicts a partial cross-sectional view of the semiconductor topography according to another embodiment, wherein an LDD implant is self-aligned to the opposed sidewall surfaces of the gate conductor/TiN structure to form LDD areas within the substrate, subsequent to the step in FIG. 8.
Figure 10B:
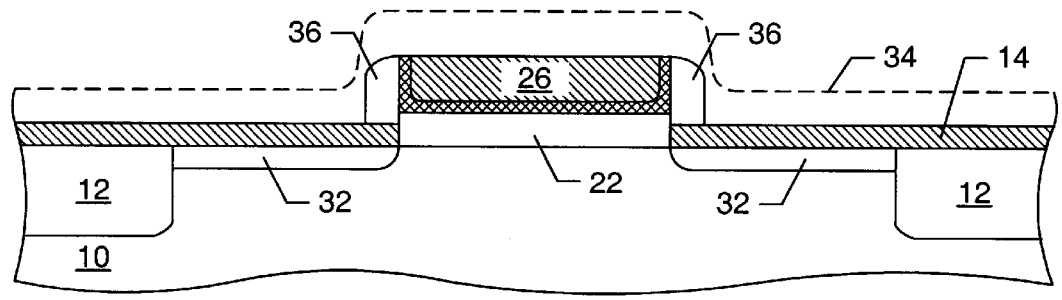
Figure 10C:
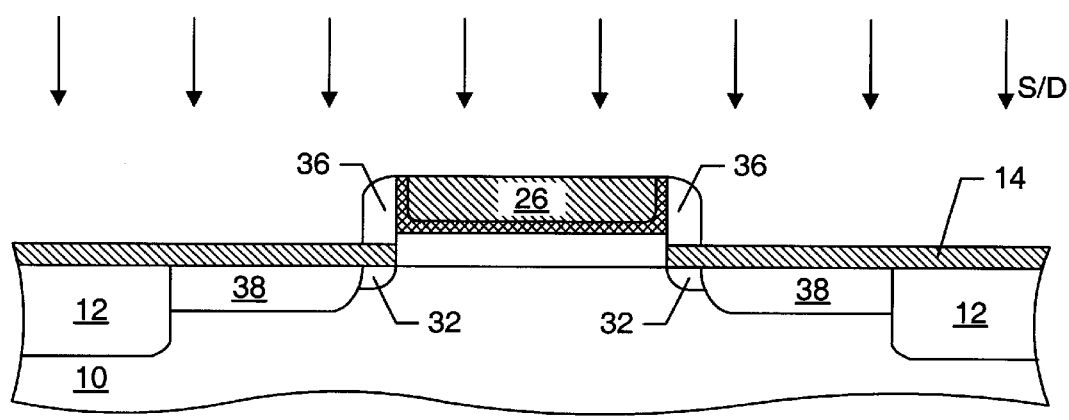
FIG. 10c depicts a partial cross-sectional view of the semiconductor topography, wherein a source/drain implant is self-aligned to the outer lateral edges of the sidewall spacers to form source and drain regions laterally spaced from the gate conductor/TiN structure, subsequent to the step in FIG. 10b.

FIGS. 10a, 10b, and 10c illustrate an alternative sequence of steps that may be used instead of the step depicted in FIG. 9. FIG. 10a depicts an LDD implant being self-aligned to the opposed sidewall surfaces of the gate conductor/TiN structure. In this manner, LDD areas 32 are formed within substrate 10 on opposite sides of gate dielectric 22. Thereafter, dielectric sidewall spacers 36 may be formed laterally extending from the opposed sidewall surfaces of the gate conductor/TiN structure, as depicted in FIG. 10b. The formation of sidewall spacers 36 involves first depositing a dielectric material comprising, e.g., oxide or silicon nitride, across the topography, as indicated by dotted line 34. The horizontally oriented surfaces of the dielectric material is then anisotropically etched at a faster rate than vertically oriented surfaces. As a result of the etch, the dielectric material is only retained laterally adjacent the sidewalls surfaces of the gate conductor/TiN structure in the form of sidewall spacers 36. As shown in FIG. 10c, a S/D implant is then performed at a higher dose and energy than the LDD implant. The S/D implant is self-aligned to the outer lateral surfaces of sidewall spacers 36. In this manner, source and drain regions 38 are formed within substrate 10 a spaced distance from gate conductor 26. As such, LDD areas 32, which contain a lighter concentration of dopant than source and drain regions 38, only remain in the lateral areas beneath sidewall spacers 36. Together, LDD areas 32 and source and drain regions 38 form graded junctions which increase in concentration in a lateral direction away from gate conductor 26. A post-implant anneal may be performed to position and activate the as-implanted impurities.

Figure 11:
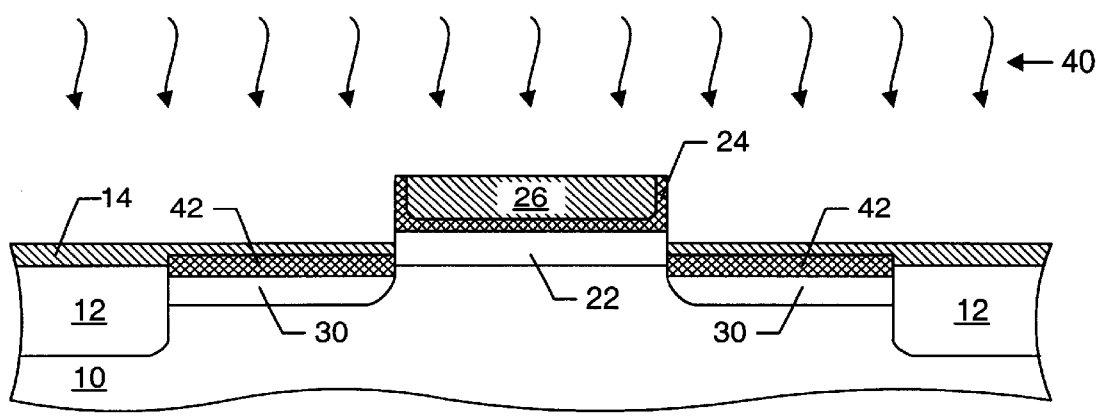
FIG. 11 depicts a partial cross-sectional view of the semiconductor topography, wherein the refractory metal layer is heated to promote a reaction between silicon atoms within the source and drain regions and overlying metal atoms, thereby forming salicide structures upon the source and drain regions, subsequent to the step in FIG. 10.
Figure 12:
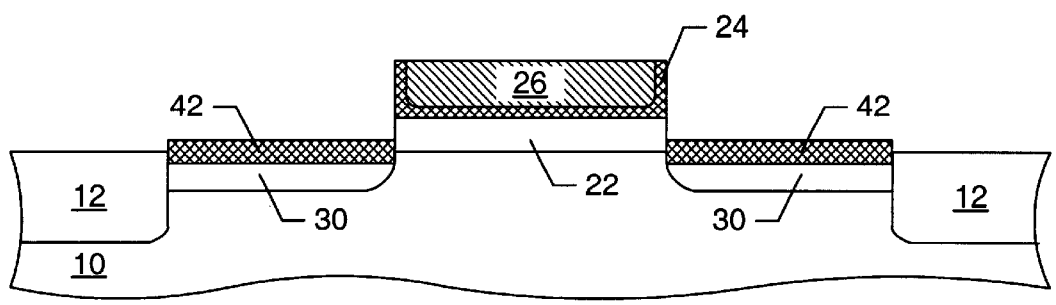
FIG. 12 depicts a partial cross-sectional view of the semiconductor topography, wherein unreacted metal is selectively removed from the topography to expose the salicide structures which are interposed between the metal oxide gate dielectric, subsequent to the step in FIG. 11.

Subsequent to the step depicted in FIG. 9, salicide structures 42 may be formed upon source and drain regions 30, as shown in FIG. 11. Refractory metal layer 14 may be subjected to radiation 40 to cause the metal atoms of the refractory metal layer to undergo cross-diffusion and reaction with silicon atoms within substrate 10. Although radiation 40 may be supplied from an annealing furnace, it is preferably provided from an RTP chamber. The RTP step may be performed at a temperature of 600 to 800° C. for approximately 15 to 60 seconds. Turning to FIG. 12, any unreacted metal may be selectively etched from the topography. Since the resulting salicide structures 42 are fabricated from the same metal layer as gate dielectric 22, salicide structures 42 and gate dielectric 22 comprise the same type of metal atoms. For example, gate dielectric 22 may comprise $TiO_2$, and salicide structures 42 may comprise $TiSi_2$. The thickness of gate dielectric 22 is sufficient to prevent salicide structures 42 from contacting TiN layer 24 and gate conductor 26. Accordingly, dielectric sidewall spacers do not necessarily have to be formed between the sidewall surfaces of the gate conductor/TiN structure and salicide structures 42 to prevent silicide bridging. Using a relatively thin refractory metal layer to form salicide structures 42 ensures that only a small amount of source and drain regions 30 is consumed during salicidation.

It will be appreciated to those skilled in the art having the benefit of this disclosure that this invention is believed to provide a method for forming a metal oxide gate dielectric and salicide structures from a unitary layer of refractory metal. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. An integrated circuit comprising:
   a metal oxide gate dielectric interposed between metal silicide structures residing upon a silicon-based substrate, wherein the metal silicide structures are located only above source and drain regions that reside within the substrate, and wherein the metal oxide gate dielectric and the metal silicide structures comprise the same type of metal atoms;

a gate conductor residing upon the metal oxide gate dielectric, wherein sidewall surfaces of the gate conductor are not in contact with metal silicide formations; and a titanium nitride layer bounding opposed sidewall surfaces and a bottom surface of the gate conductor.

2. The integrated circuit of claim 1, wherein the gate dielectric comprises titanium oxide and the metal silicide structures comprise titanium silicide.

3. The integrated circuit of claim 1, wherein the gate dielectric comprises a thickness of approximately 125 to 250 Å.

4. The integrated circuit of claim 1, wherein the gate conductor comprises a conductive material selected from the group consisting of doped polysilicon, tungsten, titanium, tantalum, and cobalt.

5. The integrated circuit of claim 1, further comprising a pair of sidewall spacers extending laterally from opposed sidewall surfaces of the titanium nitride layer and lightly doped drain regions arranged within the substrate beneath the sidewall spacers, adjacent the source and drain regions.

6. The integrated circuit of claim 1, wherein upper surfaces of the metal silicide structures are lower than upper surfaces of the metal oxide gate dielectric, and wherein lower surfaces of the metal silicide structures are lower than the lower surface of the metal oxide gate dielectric.

7. The integrated circuit of claim 1, wherein the metal oxide gate dielectric comprises metal oxide thermally grown from a refractory metal layer.

8. The integrated circuit of claim 1, wherein the metal oxide gate dielectric is sufficiently thick to inhibit electrical communication between the metal silicide structures and the gate conductor.

9. The integrated circuit of claim 1, wherein the gate conductor is the same width as the metal oxide gate dielectric.

10. The integrated circuit of claim 1, wherein an upper surface of the metal oxide gate dielectric is above respective upper surfaces of the metal silicide structures.

11. A transistor comprising:

a gate dielectric located on a semiconductor substrate;

a gate conductor residing above the gate dielectric;

a titanium nitride layer bounding opposed sidewall surfaces and a lower surface of the gate conductor;

silicide structures located on the semiconductor substrate and laterally displaced from opposed sidewall surfaces of the gate dielectric, wherein the silicide structures comprise a metal silicide; and wherein the gate dielectric comprises a metal oxide, and wherein the metal oxide and the metal suicide comprise the same type of metal atom.

12. The transistor of claim 11, wherein the silicide structures are located only above source and drain regions within the semiconductor substrate.

13. The transistor of claim 11, wherein the metal oxide comprises titanium oxide and the metal silicide comprises titanium silicide.

14. The transistor of claim 11, wherein upper surfaces of the silicide structures are lower than an upper surface of the gate dielectric, and wherein lower surfaces of the silicide structures are lower than the lower surface of the gate dielectric.

15. The transistor of claim 11, wherein the gate conductor comprises a conductive material, and wherein the conductive material comprises doped polysilicon, tungsten, titanium, tantalum, or cobalt.

16. The transistor of claim 11, further comprising a pair of sidewall spacers extending laterally from opposed sidewall surfaces of the titanium nitride layer and lightly doped drain regions arranged within the substrate beneath the sidewall spacers, adjacent source and drain regions.

17. The transistor of claim 11, wherein the gate dielectric comprises a metal oxide thermally grown from a refractory metal layer.

18. The transistor of claim 11, wherein the upper surfaces of the titanium nitride layer are substantially coplanar with the upper surface of the gate conductor.

19. The transistor of claim 11, wherein the gate dielectric is sufficiently thick to inhibit electrical communication between the suicide structures and the titanium nitride layer.

* * * * *

UNITED STATES PATENT AND TRADEMARK OFFICE
CERTIFICATE OF CORRECTION

PATENT NO.   : 6,222,240 B1
DATED        : April 24, 2001
INVENTOR(S)  : Gardner et al.

It is certified that error appears in the above-identified patent and that said Letters Patent is hereby corrected as shown below:

Column 10, claim 19,
Line 41, after the phrase "between the" please delete the word "suicide" and substitute therefor -- silicide --.

Signed and Sealed this

Twenty-eighth Day of August, 2001

Attest:

NICHOLAS P. GODICI
*Acting Director of the United States Patent and Trademark Office*

*Attesting Officer*